United States Patent
Zhang et al.

(10) Patent No.: US 8,344,487 B2
(45) Date of Patent: Jan. 1, 2013

(54) STRESS MITIGATION IN PACKAGED MICROCHIPS

(75) Inventors: Xin Zhang, Acton, MA (US); Michael Judy, Ipswich, MA (US); Kevin H. L. Chau, Danville, CA (US); Nelson Kuan, Brookline, MA (US); Timothy Spooner, Dunstable, MA (US); Chetan Paydenkar, Cambridge, MA (US); Peter Farrell, Lunenburg, MA (US)

(73) Assignee: Analog Devices, Inc., Norwood, MA (US)

( * ) Notice: Subject to any disclaimer, the term of this patent is extended or adjusted under 35 U.S.C. 154(b) by 11 days.

(21) Appl. No.: 11/770,369

(22) Filed: Jun. 28, 2007

(65) Prior Publication Data

US 2009/0230521 A2 Sep. 17, 2009
US 2010/0013067 A9 Jan. 21, 2010

Related U.S. Application Data

(60) Provisional application No. 60/817,652, filed on Jun. 29, 2006, provisional application No. 60/830,640, filed on Jul. 13, 2006.

(51) Int. Cl.
*H01L 23/495* (2006.01)

(52) U.S. Cl. ........ 257/669; 257/738; 257/685; 257/686; 257/E23.045; 438/118; 438/126; 438/127; 438/666

(58) Field of Classification Search .......... 257/676, 257/738, 685–686, 774, 737, 666, E23.045; 438/118, 126–127, 123–124
See application file for complete search history.

(56) References Cited

U.S. PATENT DOCUMENTS

| | | | |
|---|---|---|---|
| 3,839,660 A | 10/1974 | Stryker | 357/67 |
| 4,492,825 A | 1/1985 | Brzezinski et al. | 179/111 |
| 4,524,247 A | 6/1985 | Lindenberger et al. | 179/111 |
| 4,533,795 A | 8/1985 | Baumhauer, Jr. et al. | 179/111 |
| 4,558,184 A | 12/1985 | Busch-Vishniac et al. | 179/111 |
| 4,710,744 A | 12/1987 | Wamstad | 338/4 |
| 4,740,410 A | 4/1988 | Muller et al. | 428/133 |
| 4,744,863 A | 5/1988 | Guckel et al. | 156/653 |
| 4,776,019 A | 10/1988 | Miyatake | 381/174 |
| 4,800,758 A | 1/1989 | Knecht et al. | 73/727 |
| 4,825,335 A | 4/1989 | Wilner | 361/283 |

(Continued)

FOREIGN PATENT DOCUMENTS

EP 0 788 157 A2 6/1997

(Continued)

OTHER PUBLICATIONS

Blackwell, *The Electronic Packaging Handbook*, CRC Press LLC, pp. 2-3, 7-1, 7-12, A-9, and A-11, 2000.

(Continued)

*Primary Examiner* — Evan Pert
*Assistant Examiner* — Mark A Laurenzi
(74) *Attorney, Agent, or Firm* — Sunstein Kann Murphy & Timbers LLP

(57) ABSTRACT

A packaged microchip has a lead frame with a die directly contacting at least a single, contiguous portion of the lead frame. The portion of the lead frame has a top surface forming a concavity and contacting the die. The packaged microchip also has mold material substantially encapsulating part of the top surface of the portion of the lead frame.

18 Claims, 4 Drawing Sheets

U.S. PATENT DOCUMENTS

| | | | |
|---|---|---|---|
| 4,853,669 A | 8/1989 | Guckel et al. | 338/4 |
| 4,872,047 A | 10/1989 | Fister et al. | 357/67 |
| 4,918,032 A | 4/1990 | Jain et al. | 437/228 |
| 4,948,757 A | 8/1990 | Jain et al. | 437/240 |
| 4,996,082 A | 2/1991 | Guckel et al. | 427/99 |
| 5,067,007 A | 11/1991 | Otsuka et al. | 357/74 |
| 5,090,254 A | 2/1992 | Guckel et al. | 73/862.59 |
| 5,105,258 A | 4/1992 | Silvis et al. | 257/748 |
| 5,113,466 A | 5/1992 | Acarlar et al. | 385/88 |
| 5,146,435 A | 9/1992 | Bernstein | 367/181 |
| 5,172,213 A * | 12/1992 | Zimmerman | 257/796 |
| 5,178,015 A | 1/1993 | Loeppert et al. | 73/718 |
| 5,188,983 A | 2/1993 | Guckel et al. | 437/209 |
| 5,207,102 A | 5/1993 | Takahashi et al. | 73/727 |
| 5,241,133 A | 8/1993 | Mullen, III et al. | 174/52.4 |
| 5,273,939 A | 12/1993 | Becker et al. | 437/209 |
| 5,303,210 A | 4/1994 | Bernstein | 367/181 |
| 5,314,572 A | 5/1994 | Core et al. | 156/643 |
| 5,315,155 A | 5/1994 | O'Donnelly et al. | 257/711 |
| 5,317,107 A | 5/1994 | Osorio | 174/52.4 |
| 5,336,928 A | 8/1994 | Neugebauer et al. | 257/758 |
| 5,452,268 A | 9/1995 | Bernstein | 367/181 |
| 5,468,999 A | 11/1995 | Lin et al. | 257/784 |
| 5,490,220 A | 2/1996 | Loeppert | 381/168 |
| 5,515,732 A | 5/1996 | Willcox et al. | 73/724 |
| 5,593,926 A | 1/1997 | Fujihira | 437/209 |
| 5,596,222 A | 1/1997 | Bernstein | 257/620 |
| 5,608,265 A * | 3/1997 | Kitano et al. | 257/738 |
| 5,629,566 A | 5/1997 | Doi et al. | 257/789 |
| 5,633,552 A | 5/1997 | Lee et al. | 310/311 |
| 5,658,710 A | 8/1997 | Neukermans | 430/320 |
| 5,684,324 A | 11/1997 | Bernstein | 257/415 |
| 5,692,060 A | 11/1997 | Wickstrom | 381/169 |
| 5,740,261 A | 4/1998 | Loeppert et al. | 381/168 |
| 5,828,127 A | 10/1998 | Yamagata et al. | 257/706 |
| 5,870,482 A | 2/1999 | Loeppert et al. | 381/174 |
| 5,901,046 A | 5/1999 | Ohta et al. | 361/760 |
| 5,923,995 A | 7/1999 | Kao et al. | 438/460 |
| 5,939,633 A | 8/1999 | Judy | 73/514.32 |
| 5,945,605 A | 8/1999 | Julian et al. | 73/727 |
| 5,956,292 A | 9/1999 | Bernstein | 367/140 |
| 5,960,093 A | 9/1999 | Miller | 381/324 |
| 5,994,161 A | 11/1999 | Bitko et al. | 438/53 |
| 6,084,292 A * | 7/2000 | Shinohara | 257/676 |
| 6,128,961 A | 10/2000 | Haronian | 73/774 |
| 6,169,328 B1 | 1/2001 | Mitchell et al. | 257/778 |
| 6,243,474 B1 | 6/2001 | Tai et al. | 381/174 |
| 6,249,075 B1 | 6/2001 | Bishop et al. | 310/338 |
| 6,309,915 B1 | 10/2001 | Distefano | 438/127 |
| 6,329,706 B1 | 12/2001 | Nam | 257/666 |
| 6,384,472 B1 | 5/2002 | Huang | 257/680 |
| 6,384,473 B1 | 5/2002 | Peterson et al. | 257/680 |
| 6,401,545 B1 | 6/2002 | Monk et al. | 73/756 |
| 6,505,511 B1 | 1/2003 | Geen et al. | 73/504.12 |
| 6,522,762 B1 | 2/2003 | Mullenborn et al. | 381/174 |
| 6,535,460 B2 | 3/2003 | Loeppert et al. | 367/181 |
| 6,548,895 B1 | 4/2003 | Benavides et al. | 257/712 |
| 6,552,469 B1 | 4/2003 | Pederson et al. | 310/309 |
| 6,617,683 B2 | 9/2003 | Lebonheur et al. | 257/707 |
| 6,667,189 B1 | 12/2003 | Wang et al. | 438/53 |
| 6,667,557 B2 | 12/2003 | Alcoe et al. | 257/778 |
| 6,677,176 B2 | 1/2004 | Wong et al. | 438/50 |
| 6,704,427 B2 | 3/2004 | Kearey | 381/355 |
| 6,732,588 B1 | 5/2004 | Mullenborn et al. | 73/715 |
| 6,741,709 B2 | 5/2004 | Kay et al. | 381/175 |
| 6,753,583 B2 | 6/2004 | Stoffel et al. | 257/416 |
| 6,768,196 B2 | 7/2004 | Harney et al. | 257/729 |
| 6,781,231 B2 | 8/2004 | Minervini | 257/704 |
| 6,812,620 B2 | 11/2004 | Scheeper et al. | 310/324 |
| 6,816,301 B1 | 11/2004 | Schiller | 359/290 |
| 6,821,819 B1 | 11/2004 | Benavides et al. | 438/122 |
| 6,829,131 B1 | 12/2004 | Loeb et al. | 361/234 |
| 6,847,090 B2 | 1/2005 | Loeppert | 257/418 |
| 6,857,312 B2 | 2/2005 | Choe et al. | 73/170.13 |
| 6,859,542 B2 | 2/2005 | Johannsen et al. | 381/174 |
| 6,914,992 B1 | 7/2005 | van Halteren et al. | 381/113 |
| 6,984,886 B2 | 1/2006 | Ahn et al. | 257/698 |
| 7,166,911 B2 | 1/2007 | Karpman et al. | 257/711 |
| 2001/0055836 A1 | 12/2001 | Kunda | 438/108 |
| 2002/0102004 A1 | 8/2002 | Minervini | 381/175 |
| 2002/0125559 A1 | 9/2002 | Mclellan | 257/690 |
| 2003/0016839 A1 | 1/2003 | Loeppert et al. | 381/174 |
| 2003/0133588 A1 | 7/2003 | Pedersen | 381/423 |
| 2003/0189222 A1 * | 10/2003 | Itou et al. | 257/200 |
| 2004/0041254 A1 | 3/2004 | Long et al. | 257/703 |
| 2004/0056337 A1 | 3/2004 | Hasebe et al. | 257/667 |
| 2004/0179705 A1 | 9/2004 | Wang et al. | 381/175 |
| 2004/0184632 A1 | 9/2004 | Minervini | 381/355 |
| 2004/0184633 A1 | 9/2004 | Kay et al. | 381/355 |
| 2004/0262781 A1 | 12/2004 | Germain et al. | 257/787 |
| 2005/0005421 A1 | 1/2005 | Wang et al. | 29/594 |
| 2005/0018864 A1 | 1/2005 | Minervini | 381/175 |
| 2005/0089188 A1 | 4/2005 | Feng | 381/396 |
| 2005/0093117 A1 | 5/2005 | Masuda et al. | 257/676 |
| 2007/0040231 A1 | 2/2007 | Harney et al. | 257/415 |

FOREIGN PATENT DOCUMENTS

| | | |
|---|---|---|
| EP | 0 788 157 A3 | 6/1997 |
| JP | 60077434 A | 5/1985 |
| WO | WO 83/01362 | 4/1983 |
| WO | WO 91/05368 A | 4/1991 |
| WO | WO 01/20948 | 3/2001 |
| WO | WO 02/45463 | 6/2002 |
| WO | WO 2004/022477 | 3/2004 |
| WO | WO 2005/036698 | 4/2005 |
| WO | WO 2007/030345 A2 | 3/2007 |
| WO | WO 2007/030345 A3 | 3/2007 |

OTHER PUBLICATIONS

Brown, William D. (Ed.), *Advanced Electronic Packaging with Emphasis on Multichip Modules*, Institute of Electrical and Electronics Engineers, Inc., pp. 4-8, 568, 1999.

Tummala, Rao R. et al. (Eds.), *Microelectronics Packaging Handbook, Semiconductor Packaging Part II*, Second Edition, Chapman & Hall, pp. 11-12, 1997.

Pecht, Michael (Ed.), *Handbook of Electronic Package Design*, Marcel Dekker, Inc. pp. 173, 179, 196, 210, 736, 744, 821 and 832, 1991.

Heuberger, *Mikromechanik*, Springer Verlang A.G., pp. 470-476, 1989 (With translation).

Department of Defense, *Test Method Standard Microcircuits*, FSC 5962, completed 1997.

Patent Abstracts of Japan, vol. 009, No. 216 (E-340), Sep. 3, 1985 & JP 60 077434 A (Mitsubishi Denki KK), May 2, 1985.

Patent Abstracts of Japan, vol. 1995, No. 09, Oct. 31, 1995 & JP 07 142518 A (Hitachi Ltd), Jun. 2, 1995.

Patent Abstracts of Japan, vol. 1996, No. 09, Sep. 30, 1996 & JP 08 116007 A (NEC Corp.), May 7, 1996.

Patent Abstracts of Japan, vol. 017, No. 672 (E-1474) Dec. 10, 1993 & JP 05 226501 A (Nissan Motor Co. Ltd), Sep. 3, 1993.

Patent Abstracts of Japan, vol. 012, No. 111 (E-598), Apr. 8, 1988 & JP 62 241335 A (Hitachi Ltd; others: 01), Oct. 22, 1987.

Prismark Partners, "The Prismark Wireless Technology Report—Mar. 2005", *Prismark Partners LLC*; www.prismark.com, pp. 1-44.

Neumann, Jr. et al., *A Fully-Integrated CMOS-MEMS Audio Microphone*, The 12th International Conference on Solid State Sensors, Actuators and Microsystems Jun. 8-12, 2003, 4 pages.

Fan et al., *Development of Artificial Lateral-Line Flow Sensors*, Solid-State Sensor, Actuator and Microsystems Workshop, Jun. 2-6, 2002, 4 pages.

Hsieh et al., *A Micromachined Thin-film Teflon Electret Microphone*, Department of Electrical Engineering California Institute of Technology, 1997, 4 pages.

Bajdechi et al., *Single-Chip Low-Voltage Analog-to-Digital Interface for Encapsulation with Electret Microphone*, The 11th International Conference on Solid-State Sensors and Actuators, Jun. 10-14, 2001, 4 pages.

Schafer et al., *Micromachined Condenser Microphone for Hearing Aid Use*, Solid-State Sensor and Actuator Workshop, Jun. 8-11, 1998, 4 pages.

*Microphone industry to expand MEMS-based offerings*, The Information Network, online <www.theinformationnet.com>, printed Feb. 1, 2005, Nov. 14, 2003, 2 pages.

Kabir et al., *High Sensitivity Acoustic Transducers with Thin P+ Membranes and Gold Back-Plate*, Sensors and Actuators, vol. 78, Issue 2-3, Dec. 17, 1999, 17 pages.

Zou et al., *A Novel Integrated Silicon Capacitive Microphone—Floating Electrode "Electret" Microphone (FEEM)*, Journal of Microelectromechanical Systems, vol. 7, No. 2, Jun. 1998, 11 pages.

Ko et al., *Piezoelectric Membrane Acoustic Devices*, IEEE, 2002, 4 pages.

Chen et al., *Single-Chip Condenser Miniature Microphone with a High Sensitive Circular Corrugated Diaphragm*, IEEE, 2002, 4 pages.

Ma et al., *Design and Fabrication of an Integrated Programmable Floating-Gate Microphone*, IEEE, 2002, 4 pages.

Maxim Integrated Products, *Electret Condenser Microphone Cartridge Preamplifier*, Maxim Integrated Products, Jul. 2002, 9 pages.

Ono et al., *Design and Experiments of Bio-mimicry Sound Source Localization Sensor with Gimbal-Supported Circular Diaphragm*, The 12$^{th}$ International Conference on Solid State Sensors, Actuators and Microsystems, Jun. 8-12, 2003, 4 pages.

Pedersen et al., *A Polymer Condenser Microphone on Silicon with On-Chip CMOS Amplifier*, Solid State Sensors and Actuators, 1997, 3 pages.

Yovcheva et al., *Investigation on Surface Potential Decay in PP Corona Electrets*, BPU-5: Fifth General Conference of the Balkan Physical Union, Aug. 25-29, 2003, 4 pages.

Fuldner et al., *Silicon Microphones with Low Stress Membranes*, The 11$^{th}$ International Conference on Solid-State Sensors and Actuators, Jun. 10-14, 2001, 4 pages.

Bernstein et al., *High Sensitivity MEMS Ultrasound Arrays by Lateral Ferroelectric Polarization*, Solid-State Sensor and Actuator Workshop, Jun. 4-8, 2000, 4 pages.

Sheplak et al., *A Wafer-Bonded, Silicon-Nitride Membrane Microphone with Dielectrically-Isolated, Single-Crystal Silicon Piezoresistors*, Solid-State Sensor and Actuator Workshop, Jun. 8-11, 1998, 4 pages.

Cunningham et al., *Wide bandwidth silicon nitride membrane microphones*, SPIE vol. 3223, Sep. 1997, 9 pages.

*Phone-Or/Technology*, online <file://C:\Documents%20and%20Settings\bmansfield\Local%20 Settings\Temporary%20-Internet%20Files\OLKE\Phone-Or%20%...>, printed Feb. 1, 2005, 2 pages.

Mason, Jack, *Companies Compete to Be Heard on the Increasingly Noisy MEMS Phone Market*, Small Times: News about MEMS, Nanotechnology and Microsystems, Jul. 18, 2003, 4 pages.

Hall et al., *Self-Calibrating Micromachined Microphones with Integrated Optical Displacement Detection*, The 11th International Conference on Solid State Sensors and Actuators, Jun. 10-14, 2001, 4 pages.

Stahl, et al., *Thin Film Encapsulation of Acceleration Sensors Using Polysilicon Sacrificial Layer*, Transducers '03, The 12$^{th}$ International Conference on Solid State Sensors, Actuators and Microsystems, Jun. 8-12, 2003, 4 pages.

Bernstein, *MEMS Air Acoustics Research the Charles Stark Draper Laboratory*, PowerPoint Presentation, Aug. 1999, 8 pages.

Weigold et al., *A MEMS Condenser Microphone for Consumer Applications*, Analog Devices, Inc. and Pixtronix, Inc., Jan. 2006, 3 pages.

Gale et al., *MEMS Packaging*, University of Utah, Microsystems Principles, PowerPoint Presentation, Oct. 11, 2001, 8 pages.

*Liquid Crystal Polymer (LCP) Air Cavity Packages*, Quantum Leap Packaging, Inc., Brochure, 2004, 2 pages.

Rugg et al., *Thermal Package Enhancement Improves Hard Disk Drive Data Transfer Performance*, 6 pages.

Kopola et al., *MEMS Sensor Packaging Using LTCC Substrate Technology*, VTT Electronics, Proceedings of SPIE vol. 4592, 2001, pp. 148-158.

Harper (Editor-in-Chief), *Electronic Packaging and Interconnection Handbook*, Third Edition, McGraw-Hill, Chapter 7, Section 7.2.3.1, 2000, 5 pages.

International Searching Authority, International Search Report—International Application No. PCT/US2007/072381, dated Feb. 29, 2008, together with Written Opinion of the International Searching Authority, 11 pages.

\* cited by examiner

STRESS MITIGATION IN PACKAGED MICROCHIPS

PRIORITY

This patent application claims priority from provisional U.S. patent application No. 60/817,652, filed Jun. 29, 2006, entitled, "STRESS MITIGATION IN PLASTIC PACKAGES," and naming Xin Zhang, Kevin H. L. Chau, Timothy Spooner, Peter Farrell, Michael Judy, Nelson Kuan, and Chetan Paydenkar as inventors, the disclosure of which is incorporated herein, in its entirety, by reference.

This patent application also claims priority from provisional U.S. patent application No. 60/830,640, filed Jul. 13, 2006, entitled, "STRESS MITIGATION IN PLASTIC PACKAGES," and naming Xin Zhang, Kevin H. L. Chau, Timothy Spooner, Peter Farrell, Michael Judy, Nelson Kuan, and Chetan Paydenkar as inventors, the disclosure of which is incorporated herein, in its entirety, by reference.

FIELD OF THE INVENTION

The invention generally relates to packaged microchips and, more particularly, the invention relates to stress mitigation in packaged microchips.

BACKGROUND OF THE INVENTION

The microchip industry commonly uses conventional plastic packages to protect microchips from the environment. For example, to protect its fragile microstructure, a die implementing a MEMS device may be secured within a pre-molded, plastic lead frame package. As another example, to protect its components from environmental contaminants, a die implementing an electronic circuit may be encapsulated within a post-molded, plastic lead frame package.

To those ends, the dies often are directly mounted to either or both the metal leads or metal die paddle of a lead frame within the package. This direct coupling between the die and lead frame, however, can create significant stress concentrations at the interface between the plastic/mold compound and the lead frame. For example, one widely used implementation packages a silicon die within a package having a copper lead frame. In that case, the differential between the coefficient of thermal expansion of the die and that of the lead frame is significant. Accordingly, temperature changes can cause damaging stresses between the lead frame and plastic/mold material of the package.

Undesirably, these stresses can pull and/or shear the plastic/mold material away from lead frame (i.e., causing delamination). Among other problems, this type of delamination can cause catastrophic wirebond lifting failures. Moreover, vibration forces generated by the dicing/sawing process also can cause the mold material to pull away from lead frame at the edge of the package.

SUMMARY OF THE INVENTION

In accordance with one embodiment of the invention, a packaged microchip has a lead frame with a die directly contacting at least a single, contiguous portion of the lead frame. The portion of the lead frame has a top surface forming a concavity and contacting the die. The packaged microchip also has mold material substantially encapsulating part of the top surface of the portion of the lead frame.

The packaged microchip also may have an adhesive for directly contacting the die with the portion of the lead frame. Moreover, the portion of the lead frame to which the die is attached may include a die paddle and/or a lead. The mold material, which may be a plastic material, may substantially encapsulate the die.

The lead frame and mold material illustratively form a package. For example, the package may be a pre-molded package or a post-molded package. In some embodiments, the top surface is substantially planar about the concavity.

Among other configurations, the concavity may include an elongated trench extending generally parallel to the die. The concavity/trench may between the die and the edge of the lead frame. The edge region of the lead frame may be thinner than another part of the portion of the lead frame. In some embodiments, the concavity extends through about half of the thickness of the portion of the lead frame. In addition, rather than having a single concavity, the top surface may have a plurality of concavities.

In accordance with another embodiment of the invention, a packaged microchip has a lead frame with a contiguous portion. This contiguous portion has a substantially planar top surface that forms a concavity. The microchip also has a die coupled with the top face of the portion of the lead frame, and mold material substantially encapsulating part of the top face of the portion of the lead frame.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

In illustrative embodiments, the lead frame within a molded package has a concavity in its top surface to mitigate stresses produced by differences in thermal expansion coefficients of its internal components. Specifically, the concavity should mitigate stresses resulting from differences in thermal expansion coefficients of the die and the lead frame. As a result, its molded material should be less likely than prior art designs to separate from the lead frame. Details of illustrative embodiments are discussed below.

Figure 1:
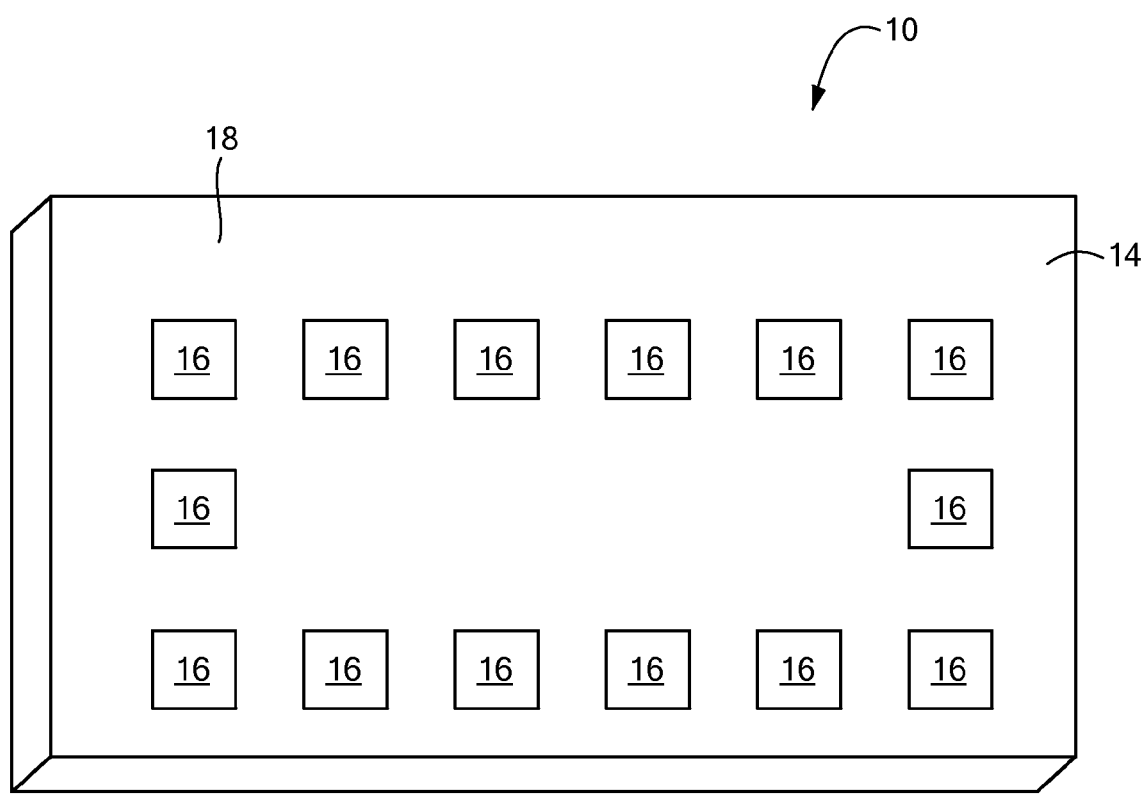
FIG. 1 schematically shows a perspective view of a packaged microchip that may be configured in accordance with illustrative embodiments of the invention.

FIG. 1 schematically shows a packaged microchip 10 that may be configured in accordance with illustrative embodiments of the invention. To those ends, the packaged microchip 10 has one or more internal dies 12 (see FIGS. 2 and 3) encapsulated by a post-molded, lead frame package 14 (also known as a "transfer molded, lead frame package"). As known by those skilled in the art, this type of package 14 has a lead frame that forms external leads 16 for connection with external components. For example, the external surfaces of the leads 16 shown in FIG. 1 may be surface mounted to an interconnect apparatus (e.g., a printed circuit board) having other components, such as a microprocessor or other type of electronic microchip. Alternatively, the leads 16 may extend from the package 14 as pins that, in a manner similar to the surface mounted package 14 shown in FIG. 1, may be mounted to a printed circuit board or other interconnect apparatus.

In addition to forming leads 16, the lead frame also is connected to an internal die 12 having a prescribed functionality. For example, among other things, the die 12 may implement the functionality of a micro-electromechanical system (a MEMS device), an application-specific integrated circuit, an analog-to-digital converter, a microprocessor, or other electronic device. Molding material 18, such as plastic (also referred to using reference number 18), substantially encapsulates the entire die 12 and most of the lead frame. The only part of the lead frame not encapsulated by the molding material 18 should be the exposed faces of the leads 16.

Although much of this discussion refers to post-molded, lead frame packages, alternative embodiments apply to pre-molded, lead frame packages. Specifically, as known by those skilled in the art, a pre-molded, lead frame package does not encapsulate the die 12 with molding material 18. Instead, the package is substantially formed with molding material 18 before the die 12 is secured within an internal chamber in its interior. Accordingly, discussion of a post-mode, lead frame package 14 is illustrative and not intended to limit all embodiments of the invention.

Figure 2:
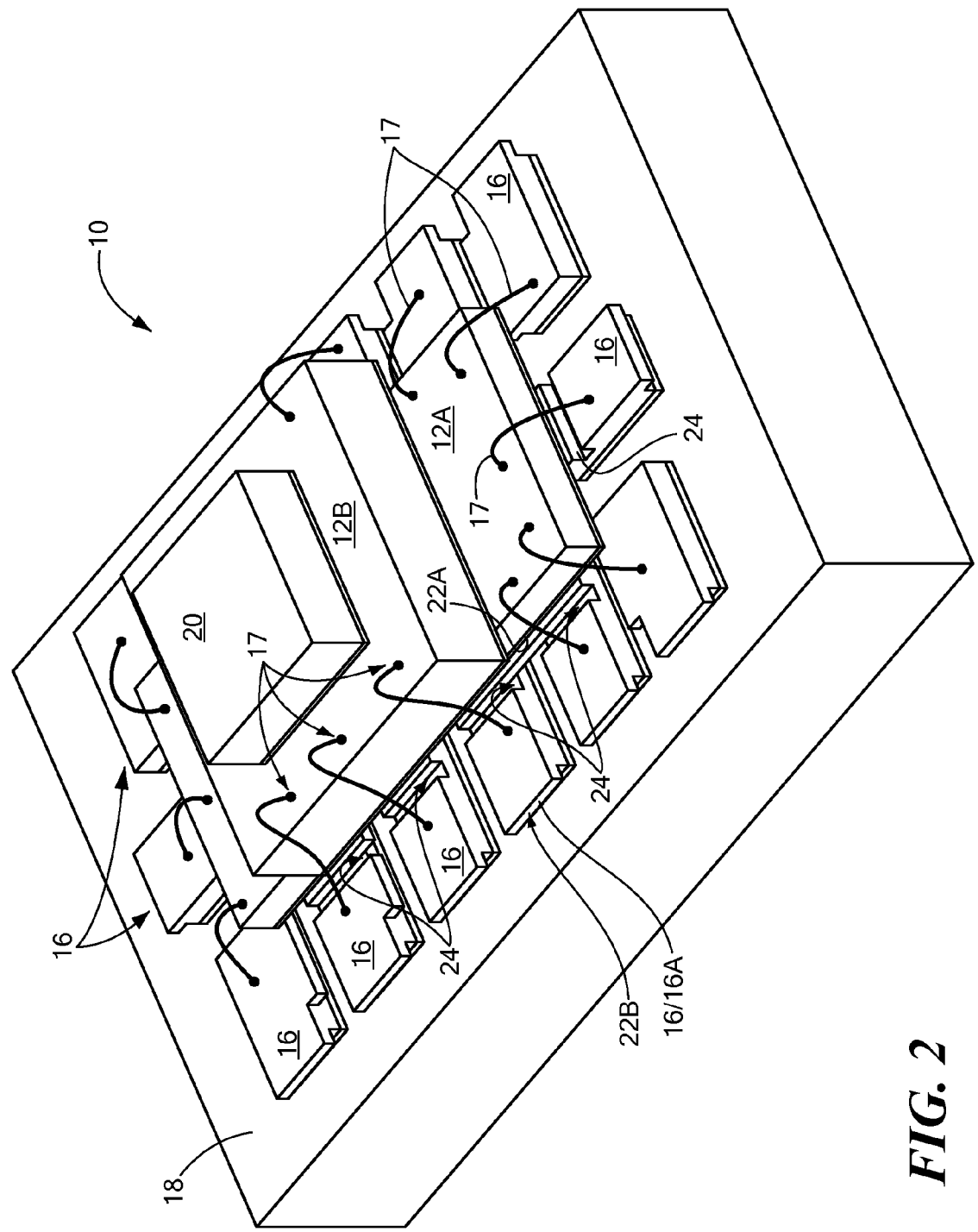
FIG. 2 schematically shows the packaged microchip of FIG. 1 with a portion of the mold material removed.
Figure 3:
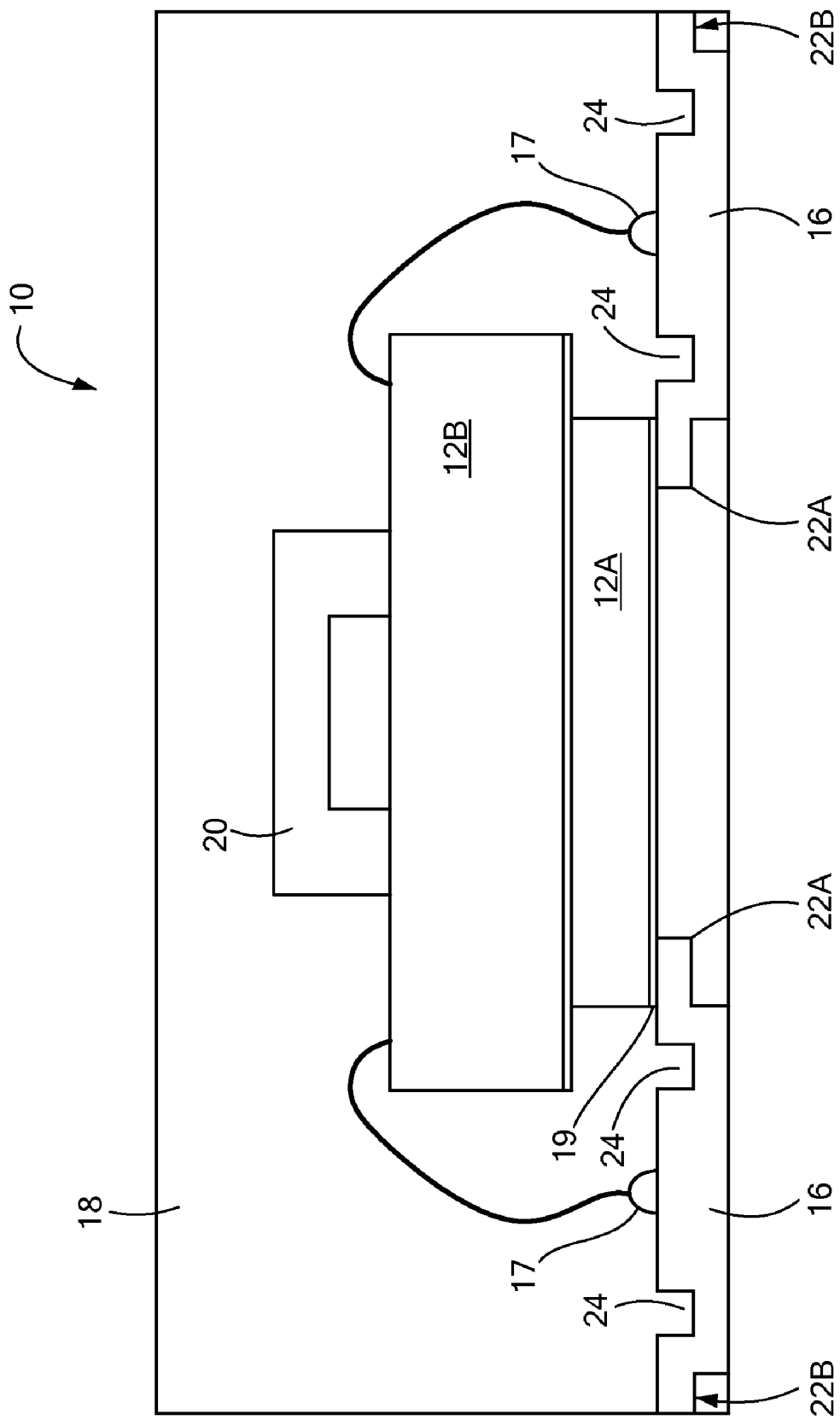
FIG. 3 schematically shows a cross-sectional view of the packaged microchip of FIG. 1.

FIG. 2 schematically shows a perspective view of one embodiment of the packaged microchip 10 of FIG. 1. To better understand this embodiment, however, this view has a portion of its molding material 18 removed. FIG. 3 schematically shows a cross-sectional view of the same packaged microchip 10. Specifically, in this embodiment, the packaged microchip 10 has multiple dies 12A and 12B. In particular, the packaged microchip 10 has a lower die 12A directly supported by a plurality of leads 16, and an upper die 12B supported by the lower die 12A. The function of these dies 12A and 12B can be any type of die that may be reasonably used with illustrative embodiments. For example, the upper die 12B may be a MEMS device, such as an accelerometer or a gyroscope, while the lower die 12A may be an application-specific integrated circuit (ASIC) configured to operate with the MEMS device. The MEMS device may have a cap 20 secured to its top surface to protect its fragile microstructure. Among other things, the cap 20 may be formed from a single crystal silicon and adhered to the top surface of the MEMS device.

It should be noted that discussion of specific types or numbers of dies 12, such as MEMS or ASICs, is illustrative and not intended to limit various embodiments. For example, various embodiments equally apply to packaged microchips having only a single die 12, more than two dies 12, or multiple dies 12 in one or both stacked or unstacked relationships.

As noted above, the lead frame has, among other things, a plurality of leads 16 supporting and adhered to the lower die 12A; namely, fourteen leads 16 in the embodiment shown and adhered by means of an adhesive layer 19 between the lower die 12A and the leads 16. The lower die 12A thus is considered to be directly connected to the lead frame (i.e., by means of the adhesive layer 19). Each lead 16 is a substantially single, contiguous portion of the overall leadframe. Wirebonds 17 electrically communicate the leads 16 with the upper and lower dies 12B and 12A.

The top surface of each of these leads 16 preferably is substantially planar, while the bottom surface of the lower die 12A also preferably is substantially planar. Accordingly, these corresponding surfaces collectively should provide a relatively large surface area for adequately securing the lower die 12A to the leads 16. In a similar manner, as detailed more clearly in FIG. 3, molding material 18 also forms a substantially planar surface that contacts the bottom face of the lower die 12A.

Some embodiments may use a lead frame and lower die 12A with substantially similar or matching thermal expansion coefficients. Various embodiments, however, permit use of materials with widely different thermal expansion coefficients.

Accordingly, in illustrative embodiments, the bottom surface of the lower die 12A and the lead frame are formed from materials having substantially different coefficients of thermal expansion. For example, the bottom surface of the lower die 12A may be formed from single crystal silicon, while the lead frame may be formed from copper. As known by those skilled in the art, single crystal silicon has a coefficient of thermal expansion of about 2.6 ppm per degree Celsius, while copper has a coefficient of thermal expansion of about 17 ppm per degree Celsius. The differential of thermal expansion coefficients between those package components and the molding material 14 also may have an impact. For example, the molding material may have a coefficient of thermal expansion of about 10 ppm per degree Celsius at temperatures below 130 degrees C., and a coefficient of thermal expansion of about 24 ppm per degree Celsius at temperatures above 130 degrees.

As noted above, this differential in the thermal expansion coefficients can effectively cause a stress/shear (hereinafter, simply "stress") that transmits along the lead frame. Undesirably, that stress can cause the molding material of prior art packaged microchips to separate from the lead, causing catastrophic device failure. For example, when the molding material separates from the lead frame, the wirebond often remains within the molding material. As a result, this movement breaks the solder connecting the wirebonds to the leads 16, thus breaking that important electrical connection. To avoid this problem, illustrative embodiments of the invention form a concavity 24 in the top surface of the portions of the lead frame supporting the lower die 12A. In this context, a concavity simply is a depression in the top surface of the lead frame. For example, among other configurations, this concavity 24 may have steep walls, gently sloping walls that do not clearly separate from others (e.g., a rounded shape), and/or one of a number of different shapes. The concavity 24 thus has a lower surface (essentially, the bottom interior surface of the concavity 24). As such, the lower die 12A is secured above this lower surface of the lead 16.

More specifically, as shown in FIGS. 2 and 3, many of the leads 16 each have a concavity 24 in their respective top surfaces in the form of an elongated trench (also referred to herein with reference number 24). For example, the lead 16 identified in FIG. 2 as lead 16A has a length dimension and a width dimension that together form a substantially planar, rectangular top surface area. As shown in FIG. 3, the lower die 12A couples with the top surface of an inner end region 22A of that lead 16A. The opposite end that lead 16A correspondingly is considered an outer end region 22B, which forms the outer end/region of the lead frame itself.

In accordance with illustrative embodiments, a concavity 24 in the form of an elongated trench 24 extends across the width of the lead 16A. This trench 24, which is completely filled with molding material 18 (not shown in FIG. 2 but shown in FIG. 3) preferably is spaced as close as possible to the side surface of the lower die 12A. In fact, in some embodiments, the trench 24 has a leading wall that substantially aligns with the side surface of the lower die 12A. In practice, however, due to practical fabrication constraints, the trench 24 may be spaced between the outer end region 22B of the lead frame and the side surface of the lower die 12A. For example, the trench 24 may be spaced between about 100 and 200 microns from the lower die 12A on a packaged microchip 10 having a footprint with dimensions of 5 millimeters by 3 millimeters. Moreover, on each lead 16, its wirebond 17 preferably is positioned between the trench 24 and the lead outer end region 22B. In some embodiments, rather than being positioned radially outwardly of the die 12, the trench 24 is positioned beneath the die 12.

As discussed below, the trench 24 may be formed by conventional etching techniques, such as half etching processes. Those skilled in the art can design the trench characteristics, such as shape and size, to minimize stress transmission for the given application. For example, the concavity 24 may extend halfway through the lead 16 and have a substantially rectangular cross-sectional shape. Alternatively, as another example, the trench 24 may have a substantially parabolic cross-sectional shape.

The concavity/trench 24 therefore effectively forms a depression in the substantially planar top surface of leads 16 having this feature. Accordingly, the top surface of the lead 16 shown in FIGS. 2 and 3 thus are considered to be planar with concave surfaces. Moreover, although it is preferred for all leads 16 to have this feature, not all leads 16 necessarily must have a concavity 24 on their top surfaces.

These trenches 24 effectively mitigate transmission of CTE (i.e., coefficient of thermal expansion) mismatch stresses along the mold compound/lead frame interface. Specifically, during experiments, the region of contact of the lead 16 and the edge of the lower die 12A transmitted stress to the first edge (i.e., the leading edge) of the trench 24. The trench 24, however, effectively stopped transmission of this transmitted stress. In other words, the portion of the lead 16 between the trench 24 and the outer end region 22B of the lead 16 received no more than a negligible amount of the stress.

It is believed that this phenomenon occurred because when the packaged microchip 10 is relatively warm, the molding material 18 is relatively flexible/malleable and thus, is much less likely to crack. As the packaged microchip 10 cools, however, the copper lead frame is believed to have contracted/compressed toward its center. Accordingly, the wall of the trench 24 that is farthest from the lower die 12A moved/compressed radially inwardly to some extent. This wall movement effectively compressed the molding material 18 within the trench 24, consequently preventing the undesired separation discussed above.

In fact, some embodiments have multiple trenches 24, such as that shown in FIG. 3. Specifically, as shown in FIG. 3, the lead 16 has a first trench 24 for substantially mitigating/eliminating the noted CTE mismatch stresses, and a second trench 24 for isolating stresses produced from the outer end region 22B of the leads 16. For example, among other things, vibrations produced by lead frame sawing/dicing processes can serve as a primary source of stress produced from the outer end region 22B of the leads 16. These trenches 24 can have a similar structure and size to those of the first trenches 24. In some embodiments, the end regions of the leads 16 also have a thinned region.

Figure 4:
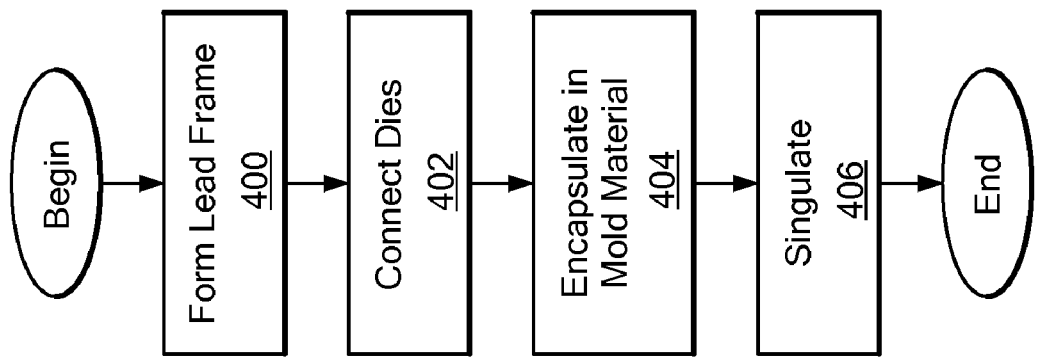
FIG. 4 shows a process of forming the packaged microchip shown in FIG. 1 in accordance with illustrative embodiments of the invention.

FIG. 4 shows a general process of forming the packaged microchip 10 in accordance with illustrative embodiments of invention. It should be noted that the process shown in FIG. 4 is significantly simplified for discussion purposes. Accordingly, the process should include additional steps not discussed.

The process begins at step 400, which forms the lead frame in a conventional manner. In illustrative embodiments, conventional etching processes form details of the lead frame in the manner prescribed by the particular application for which the packaged microchip 10 is to be used. Moreover, the packaging process preferably uses batch processing techniques. Accordingly, conventional processes effectively form a two-dimensional array of individual lead frames for receiving dies 12.

The process therefore continues by connecting dies 12 to the two-dimensional array of individual lead frames (step 402). To that end, for each individual lead frame, an adhesive layer 19 added to the its top surface and/or the bottom surface of the die 12 secures the die 12 to the lead frame. The wirebonds 17 then may be soldered between the dies 12 and the leads 16. Currently, at this stage, a two-dimensional array of the dies 12 are secured to a two-dimensional array of individual lead frames.

After connecting the dies 12, the assembly having the dies 12 and the lead frame are positioned within a molding machine to be overmolded/encapsulated with a molding material 18 (step 404). For example, the molding material 18 may be conventional plastic widely used in electronic packaging processes. As noted above, the molding material 18 substantially completely encapsulates the dies 12 and the top surface of the leads 16. Finally, the process singulates the two-dimensional array of lead frames, thus forming individual packaged microchips 10 (step 406).

Figure 5:
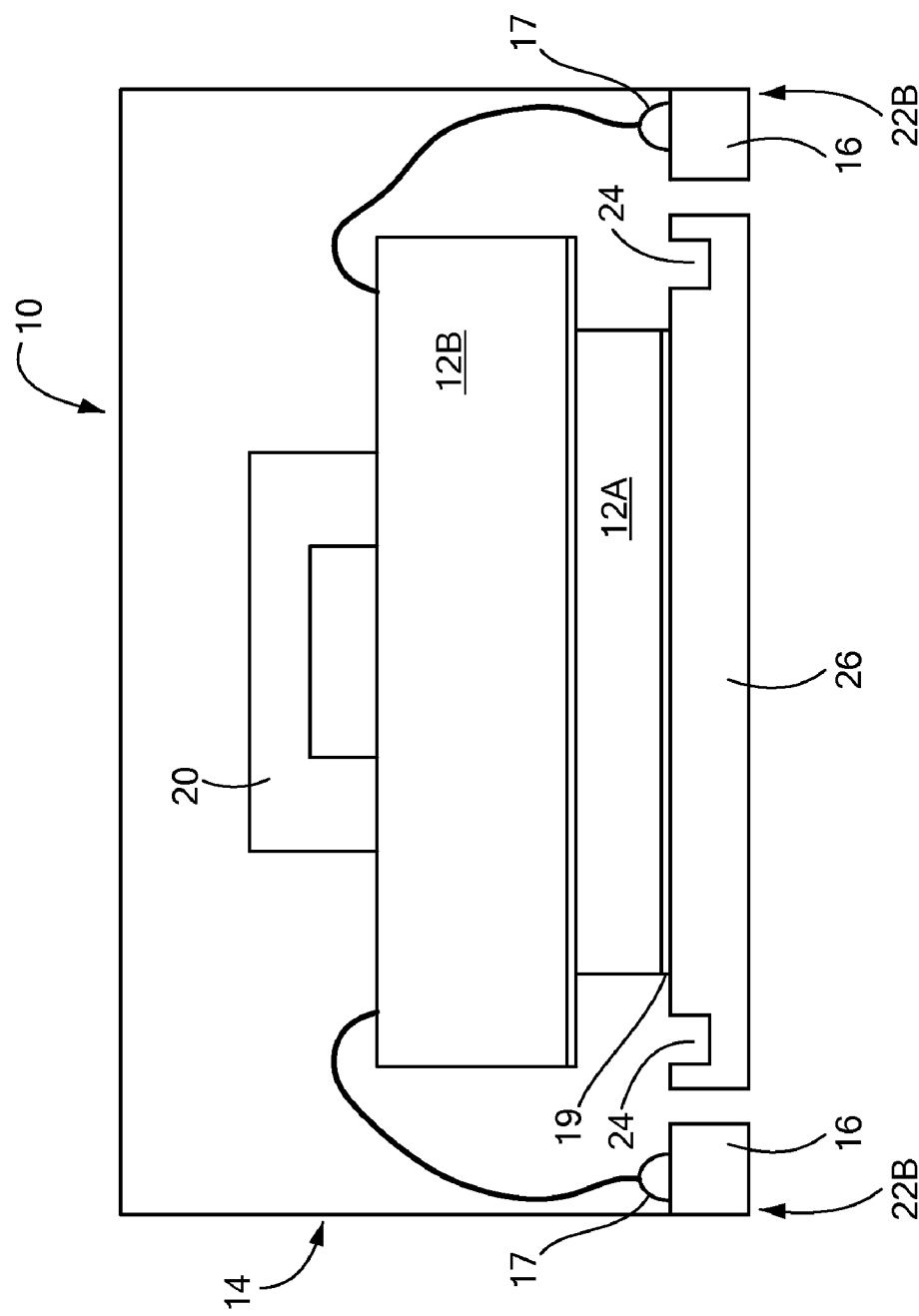
FIG. 5 schematically shows a cross-sectional view of an alternative embodiment of the packaged microchip of FIG. 1.

As noted above, in addition to applying to dies 12 supported by leads 16, various embodiments apply equally to dies 12 supported upon a die paddle 26. To that end, FIG. 5 schematically shows a cross-sectional view of one such packaged microchip, also identified by reference number 10. Specifically, the packaged microchip 10 has a die 12 secured to a die paddle 26 having a trench 24 extending about radially outward die portions.

The concavities 24 may take a number of forms other than elongated, continuous trenches 24. For example, the concavities 24 may be elongated, discontinuous trenches 24, or a plurality of round concavities in a planar surface of the lead frame. In fact, in some embodiments, the top lead frame surface is not necessarily substantially planar. Instead, such surface may be roughened or have other features.

Although the above discussion discloses various exemplary embodiments of the invention, it should be apparent that those skilled in the art can make various modifications that will achieve some of the advantages of the invention without departing from the true scope of the invention.

What is claimed is:

1. A packaged microchip comprising:
 a single lead frame comprising a plurality of electrically independent leads;
 a die, the die physically coupled to one of:
 (a) the plurality of electrically independent leads, each of the electrically independent leads having a top surface physically coupled to the die and an outer edge, the top surface comprising a plurality of concavities between the die and the outer edge; or
 (b) a paddle, the paddle being electrically independent of the plurality of leads, the paddle having a top surface physically coupled to the die, a first outer edge and a second outer edge, the die physically coupled to the paddle between the first outer edge and the second outer edge, the top surface comprising a first plurality of concavities between the die and the first outer edge, and a second plurality of cavities between the die and the second outer edge; and mold material substantially encapsulating part of the top surface of the portion of the lead frame, wherein the plurality of concavities mitigate stress transmission within the lead frame.

2. The packaged microchip as defined by claim 1 further comprising an adhesive for directly contacting the die with the portion of the lead frame.

3. The packaged microchip as defined by claim 1 wherein the plurality of concavities comprise a first concavity, and a second concavity between the die and the first concavity.

4. The packaged microchip as defined by claim 1 wherein at least one of the plurality of concavities is directly beneath the die.

5. The packaged microchip as defined by claim 1 wherein the mold material substantially encapsulates the die.

6. The packaged microchip as defined by claim 1 wherein the lead frame and mold material form a post-molded package.

7. The packaged microchip as defined by claim 1 wherein the lead frame and mold material form a pre-molded package.

8. The packaged microchip as defined by claim 1 wherein the top surface is substantially planar about each concavity.

9. The packaged microchip as defined by claim 1 wherein each concavity comprises an elongated trench extending generally parallel to the die.

10. The packaged microchip as defined by claim 8 wherein at least one concavity extends through about half of the thickness of the portion of the lead frame.

11. The packaged microchip as defined by claim 1 wherein the portion of the lead frame has an edge region, the edge region being thinner than another part of the portion of the lead frame.

12. A packaged microchip comprising:
a single lead frame having a contiguous portion with an outer edge and a substantially planar top surface;
a die physically coupled to one of:
(a) the plurality of electrically independent leads, each of the electrically independent leads having a top surface physically coupled to the die and an outer edge, the top surface comprising a plurality of concavities between the die and the outer edge; or
(b) a paddle, the paddle being electrically independent of the plurality of leads, the paddle having a top surface physically coupled to the die, a first outer edge and a second outer edge, the die physically coupled to the paddle between the first outer edge and the second outer edge, the top surface comprising a first plurality of concavities between the die and the first outer edge, and a second plurality of cavities between the die and the second outer edge; and
mold material substantially encapsulating part of the top surface of the portion of the lead frame,
wherein the plurality of concavities mitigate stress transmission within the lead frame.

13. The packaged microchip as defined by claim 12 wherein each concavity comprises an elongated trench extending generally parallel to the die.

14. The packaged microchip as defined by claim 13 wherein at least one trench extends through about half of the thickness of the portion of the lead frame.

15. The packaged microchip as defined by claim 12 wherein at least one concavity is positioned beneath the die.

16. A packaged microchip comprising:
a lead frame having a contiguous, substantially planar portion with a top surface;
a die physically coupled to one of:
(a) the plurality of electrically independent leads, each of the electrically independent leads having a top surface physically coupled to the die and an outer edge, the top surface comprising a plurality of concavities between the die and the outer edge; or
(b) a paddle, the paddle being electrically independent of the plurality of leads, the paddle having a top surface physically coupled to the die, a first outer edge and a second outer edge, the die physically coupled to the paddle between the first outer edge and the second outer edge, the top surface comprising a first plurality of concavities between the die and the first outer edge, and a second plurality of cavities between the die and the second outer edge; and
mold material substantially encapsulating part of the top surface of the portion of the lead frame to form a pre-molded package,
the top surface of the substantially planar portion of the lead frame comprising means for mitigating stress produced by coefficient of thermal expansion differentials of the lead frame and die.

17. The packaged microchip as defined by claim 16 wherein the mitigating means comprises a concavity within the planar portion of the lead frame.

18. The packaged microchip as defined by claim 1 wherein at least one of the concavities had a substantially parabolic cross-section.

* * * * *

UNITED STATES PATENT AND TRADEMARK OFFICE
CERTIFICATE OF CORRECTION

PATENT NO. : 8,344,487 B2
APPLICATION NO. : 11/770369
DATED : January 1, 2013
INVENTOR(S) : Xin Zhang et al.

It is certified that error appears in the above-identified patent and that said Letters Patent is hereby corrected as shown below:

In Col. 6, line 66
replace "cavities"
with --concavities--

In Col. 8, line 2
replace "cavities"
with --concavities--

In Col. 8, line 32
replace "cavities"
with --concavities--

Signed and Sealed this
Second Day of April, 2013

Teresa Stanek Rea
*Acting Director of the United States Patent and Trademark Office*